(12) United States Patent
Aichriedler et al.

(10) Patent No.: US 12,146,923 B2
(45) Date of Patent: Nov. 19, 2024

(54) CURRENT LEAK DETECTION FOR SOLID STATE DEVICES

(71) Applicant: Infineon Technologies Austria AG, Villach (AT)

(72) Inventors: Leo Aichriedler, Puch (AT); Gerald Wriessnegger, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 155 days.

(21) Appl. No.: 17/850,713

(22) Filed: Jun. 27, 2022

(65) Prior Publication Data

US 2023/0417841 A1 Dec. 28, 2023

(51) Int. Cl.
G01R 31/52 (2020.01)

(52) U.S. Cl.
CPC .................. G01R 31/52 (2020.01)

(58) Field of Classification Search
CPC .. G01R 31/52; G01R 31/327; G01R 31/3277; G01R 31/2621
See application file for complete search history.

(56) References Cited

U.S. PATENT DOCUMENTS

| | | | | |
|---|---|---|---|---|
| 5,172,293 | A * | 12/1992 | Matsumoto | H01H 83/144 361/96 |
| 6,348,806 | B1 * | 2/2002 | Okandan | G01R 31/275 324/762.02 |
| 6,882,172 | B1 * | 4/2005 | Suzuki | G01R 31/52 324/762.09 |
| 8,599,623 | B1 * | 12/2013 | Clark | G01R 35/00 365/201 |
| 9,362,388 | B1 * | 6/2016 | Zuniga | H01L 29/66681 |
| 11,549,992 | B2 * | 1/2023 | Kim | G01R 31/3842 |
| 11,804,833 | B1 * | 10/2023 | Ye | H03K 17/18 |
| 2005/0062490 | A1 * | 3/2005 | Polonsky | G01R 31/2621 324/754.23 |
| 2006/0164117 | A1 * | 7/2006 | Sander | G01R 31/275 324/762.09 |
| 2007/0159208 | A1 * | 7/2007 | Chen | G01K 7/015 374/E7.036 |
| 2010/0045327 | A1 * | 2/2010 | Chen | G01R 31/3277 324/750.3 |
| 2012/0250382 | A1 * | 10/2012 | Frattini | H02M 3/338 363/126 |
| 2013/0169318 | A1 * | 7/2013 | Li | G01R 31/2621 327/108 |
| 2014/0043058 | A1 | 2/2014 | Onishi | |

(Continued)

OTHER PUBLICATIONS

European Patent Office; Extended European Search Report; Nov. 3, 2023; 6 Pgs.

*Primary Examiner* — Lee E Rodak
*Assistant Examiner* — Demetrius R Pretlow
(74) *Attorney, Agent, or Firm* — Cooper Legal Group LLC (57) ABSTRACT

An apparatus comprises a solid state device and a switch in series with the solid state device. The apparatus comprises a leak detection component connected to the solid state device. The apparatus comprises a gate driver configured to drive a gate of the solid state device. The gate driver comprises test circuitry configured to apply a test voltage to the gate of the solid state device. The test voltage is less than a threshold voltage of the solid state device. The leak detection component is configured to detect a leakage of the solid state device.

20 Claims, 7 Drawing Sheets

(56) References Cited

U.S. PATENT DOCUMENTS

| | | | |
|---|---|---|---|
| 2016/0011266 A1* | 1/2016 | Osanai | G01R 31/42 |
| | | | 324/762.01 |
| 2016/0109505 A1* | 4/2016 | Capodivacca | G01R 31/2621 |
| | | | 324/762.09 |
| 2017/0122997 A1* | 5/2017 | Sakaguchi | G01R 31/2625 |
| 2018/0059166 A1* | 3/2018 | Bodano | G01R 31/27 |
| 2019/0101585 A1* | 4/2019 | Marques Martins | |
| | | | H01L 29/7848 |
| 2019/0305772 A1* | 10/2019 | Kawata | H01L 21/76 |
| 2020/0003823 A1* | 1/2020 | Szczeszynski | G01R 31/2621 |
| 2020/0049757 A1* | 2/2020 | Park | G01R 31/2601 |
| 2020/0200815 A1* | 6/2020 | Neidorff | G01R 19/0092 |
| 2020/0333393 A1* | 10/2020 | Fayneh | G01K 7/00 |
| 2021/0011090 A1* | 1/2021 | Sato | G01R 31/52 |
| 2021/0184666 A1* | 6/2021 | Strzalkowski | G01R 31/327 |
| 2021/0255235 A1* | 8/2021 | Graf | G01R 31/2608 |
| 2021/0325479 A1* | 10/2021 | Ferre Fabregas | B60L 3/0069 |
| 2022/0057446 A1* | 2/2022 | Saini | H03K 17/18 |
| 2022/0128605 A1* | 4/2022 | Chao | H03M 1/12 |
| 2022/0178999 A1* | 6/2022 | Rodrigues | G01R 31/2829 |
| 2022/0337239 A1* | 10/2022 | Kinoshita | H03K 17/687 |
| 2022/0406253 A1* | 12/2022 | Yuan | G09G 3/3233 |
| 2023/0128311 A1* | 4/2023 | Yoshida | G01R 31/2621 |
| | | | 324/762.09 |
| 2023/0152375 A1* | 5/2023 | Kurokawa | H02M 7/5395 |
| | | | 324/415 |
| 2023/0162783 A1* | 5/2023 | Park | G11C 11/4093 |
| | | | 365/189.05 |
| 2023/0213574 A1* | 7/2023 | Letor | G01R 19/32 |
| | | | 324/762.09 |
| 2023/0408577 A1* | 12/2023 | Sobolewski | G01R 31/2621 |

\* cited by examiner

CURRENT LEAK DETECTION FOR SOLID STATE DEVICES

TECHNICAL FIELD

The present disclosure relates to the field of current leak detection for solid state devices.

BACKGROUND

Solid state devices, such as solid state switches, are used in various applications such as in circuit breakers, e-Fuses, etc. In these types of applications, the solid state devices may remain in the same state for extended periods of time. For example, a solid state device of a circuit breaker may remain in an on state where the solid state device is conducting for years. The solid state device will turn off and close to stop conducting if there is an abnormal condition such as an overload or short circuit. Unfortunately, there is no way to test the solid state device to see if the solid state device is operating correctly and will be able to completely turn off in the event of the abnormal condition. This can result in catastrophic failures and damage.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises a solid state device. A switch is connected in series with the solid state device. A leak detection component is connected to the solid state device. A gate driver is configured to drive a gate of the solid state device. The gate driver comprises test circuitry configured to apply a test voltage to the gate of the solid state device. The test voltage is less than a threshold voltage of the solid state device. A leakage current of the solid state device is detected by the leak detection component.

In an embodiment of the techniques presented herein, a method is provided. The method includes turning on a solid state device using a device enable signal and turning on a load using a load enable signal while a switch is on. The load enable signal is disabled to turn off the load. The device enable signal is disabled to turn off the solid state device. The switch is turned off to interrupt supply of power to the solid state device. In response to turning off the switch, a test sequence is initiated by applying a test voltage to a gate of the solid state device. A leakage current of the solid state device is measured. A determination is made as to whether the solid state device is operating in a degraded operating state based upon the leakage current.

In an embodiment of the techniques presented herein, an apparatus is provided. The apparatus comprises a means for turning on a solid state device using a device enable signal and turning on a load using a load enable signal while a switch is on. The apparatus comprises a means for disabling the load enable signal to turn off the load. The apparatus comprises a means for disabling the device enable signal to turn off the solid state device. The apparatus comprises a means for turning off the switch to interrupt supply of power to the solid state device. The apparatus comprises a means for initiating a test sequence by applying a test voltage to a gate of the solid state device in response to turning off the switch. The apparatus comprises a means for measuring a leakage current of the solid state device. The apparatus comprises a means for determining whether the solid state device is operating in a degraded operating state based upon the leakage current In an embodiment of the techniques presented herein, an apparatus is provided. The apparatus comprises a gate driver connected to and configured to drive a gate of a solid state device in series with a switch. The solid state device is in parallel with a capacitor charged by an auxiliary voltage when the switch is open. The gate driver comprises test circuitry configured to apply a test voltage to the gate of the solid state device. A rate of change of a charge of the capacitor over time is determined while the test voltage is applied to the gate of the solid state device. The rate of change of the charge of the capacitor over time is evaluated against a threshold rate change to determine whether the solid state device is operating in a degraded operating state.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 10 is a component block diagram illustrating a leak detection component for current leak detection of a solid state device using a voltage source in accordance with at least some of the techniques presented herein.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Various devices, such as e-Fuses and circuit breakers, may utilize solid state devices that operate in either an on state or an off state. These solid state devices may comprise solid state switches, metal-oxide-semiconductor field-effect transistors (MOSFETs), etc. A solid state device may transition from one of the states to another state based upon a voltage applied to a gate of the solid state device. Once the voltage of the gate reaches a threshold voltage Vth, then the solid state device may change states, such as where the solid state device is turned on and starts conducting. In certain applications, the solid state device may remain in a particular state for an extended period of time. This period of time could be years, such as where a solid state device of a circuit breaker is in an on state until an abnormal condition of an electric supply network occurs such as an overload or short circuit. Because the solid state device remains in one state for such a long period of time, there is no way to verify that the solid state device is operating correctly and will be able to transition states when needed such as to safely turn off when the abnormal condition occurs. This can lead to catastrophic failures and damage.

The health and operability of the solid state device may deteriorate over time due to various reasons such as stress on the solid state device. One issue that can occur is that the threshold voltage Vth of the gate can drift over time, which can lead to excessive leakage current, leakage current due to a drain source on resistance (RDSon) being too low, and/or failure where the solid state device cannot switch states such as to turn off safely. As the threshold voltage Vth drifts towards 0, the solid state device may not even be able to turn off. High leakage currents due to this drift causes health deterioration of the apparatus comprising the solid state device, such as where there is always current flowing through the solid state device to a secondary side of the apparatus. This could lead to a high voltage condition on the secondary side that should otherwise be turned off. If the solid state device cannot completely shut off, then the solid state device will operate similar to a current source and deliver a significant amount of current (e.g., 10 to 100 milliamps) that can cause overheating and failure due to damage from thermal overstress behavior. The drift of the threshold voltage Vth can occur over a long period of time, and thus the leakage current may slowly increase over time. There is currently no ability to detect this slow drift and leakage current increase in-situ during operation of the apparatus comprising the solid state device.

In order to improve the ability to monitor the health of solid state devices in-situ during operation of apparatuses comprising the solid state devices, a leak detection component and leak detection technique are provided. The leak detection component is capable of testing and monitoring a solid state device of an apparatus during operation of the apparatus in order to detect imminent or future failure of the solid state device. The leak detection component is capable of identifying drift of the threshold voltage Vth of the solid state device based upon a leakage current of the solid state device measured by the leak detection component. The leakage current is detected during operation of the apparatus (e.g., while the circuit breaker or e-Fuse is installed and operational, as opposed to in a test lab environment) by the leak detection component by applying a test voltage to a gate of the solid state device. The leak detection component detects a leakage current resulting from the test voltage being applied to the gate of the solid state device. The test voltage is less than the threshold voltage Vth of the solid state device 102 such that increased leakage current will be detected if the solid state device is operating in a degraded operating state (e.g., leakage current larger than a nanoampere range of normal/expected leakage current of a non-degraded device) due to drift of the threshold voltage Vth (e.g., the threshold voltage Vth has drifted down to a smaller value than normal). Otherwise, the test voltage would not be enough voltage to cause the solid state device, operating in a non-degraded operating state, to turn on and conduct current through the solid state device. If the solid state device is operating in the degraded operating state, then various actions can be performed such as generating a warning signal of the degraded operating state (e.g., blinking a light, displaying a message, transmitting a message to a remote device, etc.).

Figure 1A:
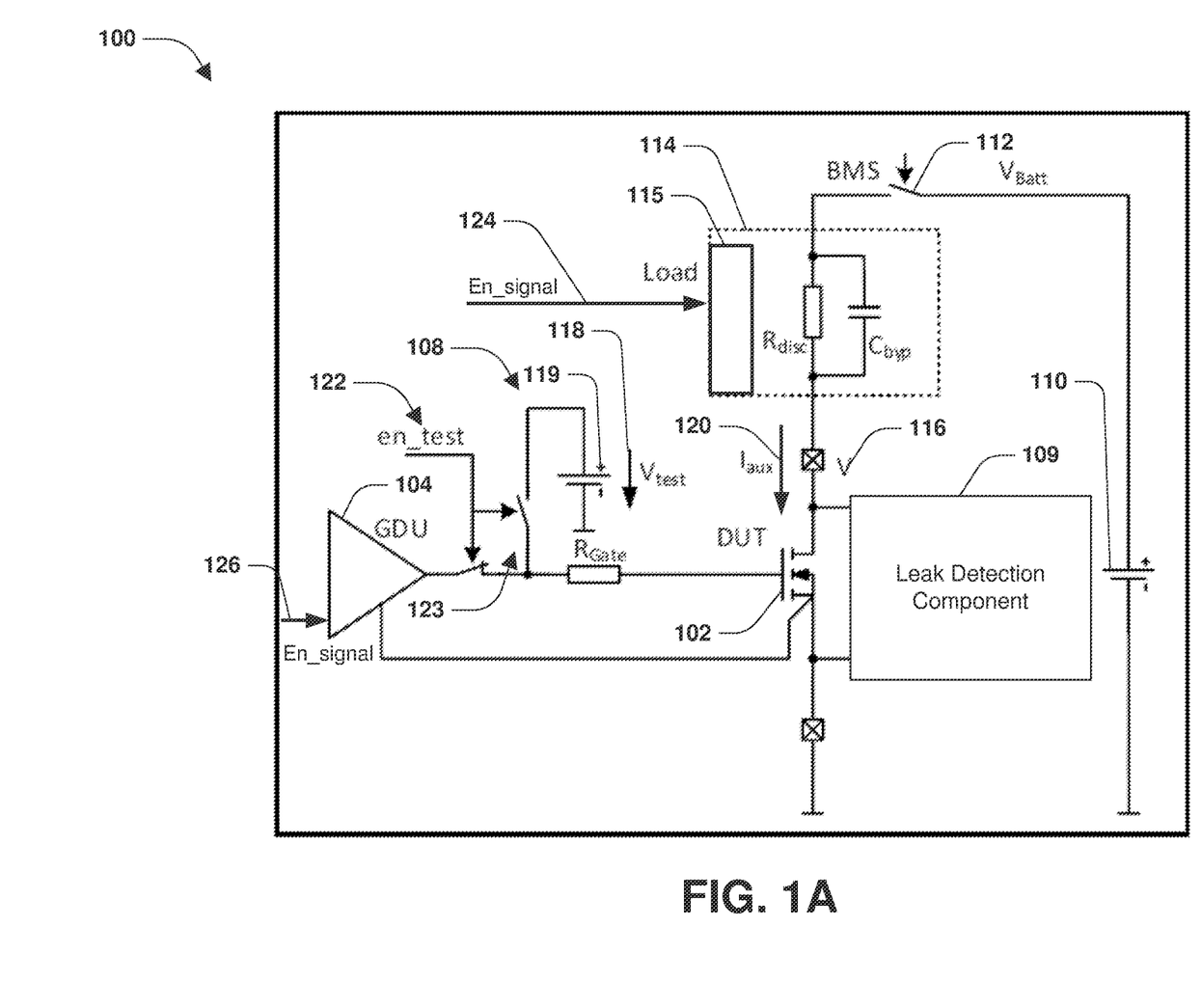
FIG. 1A is a component block diagram illustrating a leak detection component for current leak detection of a solid state device in accordance with at least some of the techniques presented herein.

FIG. 1A illustrates a leak detection component 109 configured to dynamically monitor the operating state and health of a solid state device 102 (e.g., a device under test (DUT)) of an apparatus 100. The apparatus 100 comprises a voltage source 110 that is connected to a switch 112. In some embodiments where the apparatus 100 is an e-Fuse being used for a DC breaker application, the switch 112 is a battery main switch that electrically connects and disconnects the voltage source 110 from other components of the apparatus 100 such as the solid state device 102. In some embodiments, the switch 112 may be connected in series with the solid state device 102 so that power from the voltage source 110 is supplied to the solid state device 102 (e.g., to a source of the solid state device 102) when the switch 112 is on (closed).

The apparatus 100 comprises a load 114 connected in series to the switch 112 and the solid state device 102. It may be appreciated that in some embodiments, the load 114 is represented by a resistance Rdisc and capacitance Cbyp for simplicity, but may comprise various components, circuitry, hardware, and/or software. When the load 114 is on and in an operating state, an auxiliary current Iaux 120 and a voltage 116 (e.g., Vfuse) may be applied to the source of the solid state device 102 that is connected in series to the load 114. The load 114 may be in an operational state (on) or a non-operational (off) based upon a load enable signal 124 (e.g., a signal generated by software to turn on or off the load 114). The signal 124 may be used to control a controllable portion 115 of the load 114, such as an inverter circuit. In some embodiments, a discharge circuit of the load 114 (e.g., Rdisc and Cbyp) may be permanently connected. In some embodiments, the load 114 may generate the auxiliary current Iaux 120 and the voltage 116 when the load enable signal 124 is enabled to turn on the load 114 and the switch 112 is closed so that the load 114 is connected to the voltage source 110.

A gate driver 104 (GDU) may be connected to the gate of the solid state device 102. The gate driver 104 may be configured to drive the gate of the solid state device 102 by applying a voltage to the solid state device 102 in order to operate the solid state device 102. When the gate driver 104 applies a voltage equal to or greater than the threshold voltage Vth of the solid state device 102, then the solid state device 102 will turn on into an operational state. A device enable signal 126 may be used to control the gate driver 104 to turn on or off the solid state device 102. When the solid state device 102 is to be turned on, the device enable signal 126 causes the gate driver 104 to apply the voltage, equal to or greater than the threshold voltage Vth of the solid state device 102, to the gate of the solid state device 102. When the solid state device 102 is to be turned off, the device enable signal 126 is disabled to cause the gate driver 104 to stop applying the voltage to the gate of the solid state device 102.

If the threshold voltage Vth of the solid state device 102 drifts over time to lower voltage values, then the solid state device 102 will produce significant leakage current when the solid state device 102 is supposed to be in an off state even to the point of where the solid state device 102 is not able to fully turn off by applying a normally applied off-level voltage via the gate driver 104. This can cause catastrophic failure and damage to the apparatus 100, such as where a circuit breaker is unable to turn off in the event of a short circuit or other abnormal condition. In order to detect drift of the threshold voltage Vth and/or leakage current of the solid state device 102 during operation of the apparatus 100, the leak detection component 109 in combination with a dedicated gate stimulus circuit (e.g., test circuitry 108) is used to detect these indicators of degraded performance and potential failure of the solid state device 102.

The leak detection component 109 may be connected to the solid state device 102. In some embodiments, the leak detection component 109 is connected in parallel with the solid state device 102. In some embodiments, the leak detection component 109 is connected to a source and a drain of the solid state device 102. In some embodiments, a leak detection component may be implemented as a current measurement device in series with the solid state device 102. The leak detection component 109 is configured to measure a leakage current of the solid state device 102 when a test voltage is applied to the gate of the solid state device 102 during a test sequence. The test sequence is used to test the health of the solid state device 102 for determining whether the solid state device 102 is operating in a non-degraded operating state or degraded operating state. Details of the test sequence are further described in conjunction with the method 200 of FIG. 2.

As part of performing the test sequence, the apparatus 100 includes test circuitry 108 configured to apply a test voltage 118 to the gate of the solid state device 102. In some embodiments, the test circuitry 108 is integrated into the gate driver 104. The test circuitry 108 is controlled by a test enable signal 122. In response to the test enable signal 122 indicating that the test sequence is to be initiated (e.g., a threshold amount of time has occurred since a prior test sequence was performed), the test circuitry 108 closes a series switch 123 that is in series between a test voltage source 119 and the gate of the solid state device 102. Closing the series switch 123 connects the test voltage source 119 to the gate of the solid state device 102 so that that the test voltage 118 is applied to the gate of the solid state device 102. The test voltage 118 is less than the threshold voltage Vth. In this way, the solid state device 102 will not turn on from the test voltage 118 being applied to the gate of the solid state device 102 if the solid state device 102 is operating in a non-degraded operating state and has not experienced significant drift of the threshold voltage Vth. In some embodiments, the test voltage 118 is applied to the gate of the solid state device 102 while the solid state device 102 is in an off state where the gate driver 104 is not applying a voltage to the gate of the solid state device 102.

Figure 1B:
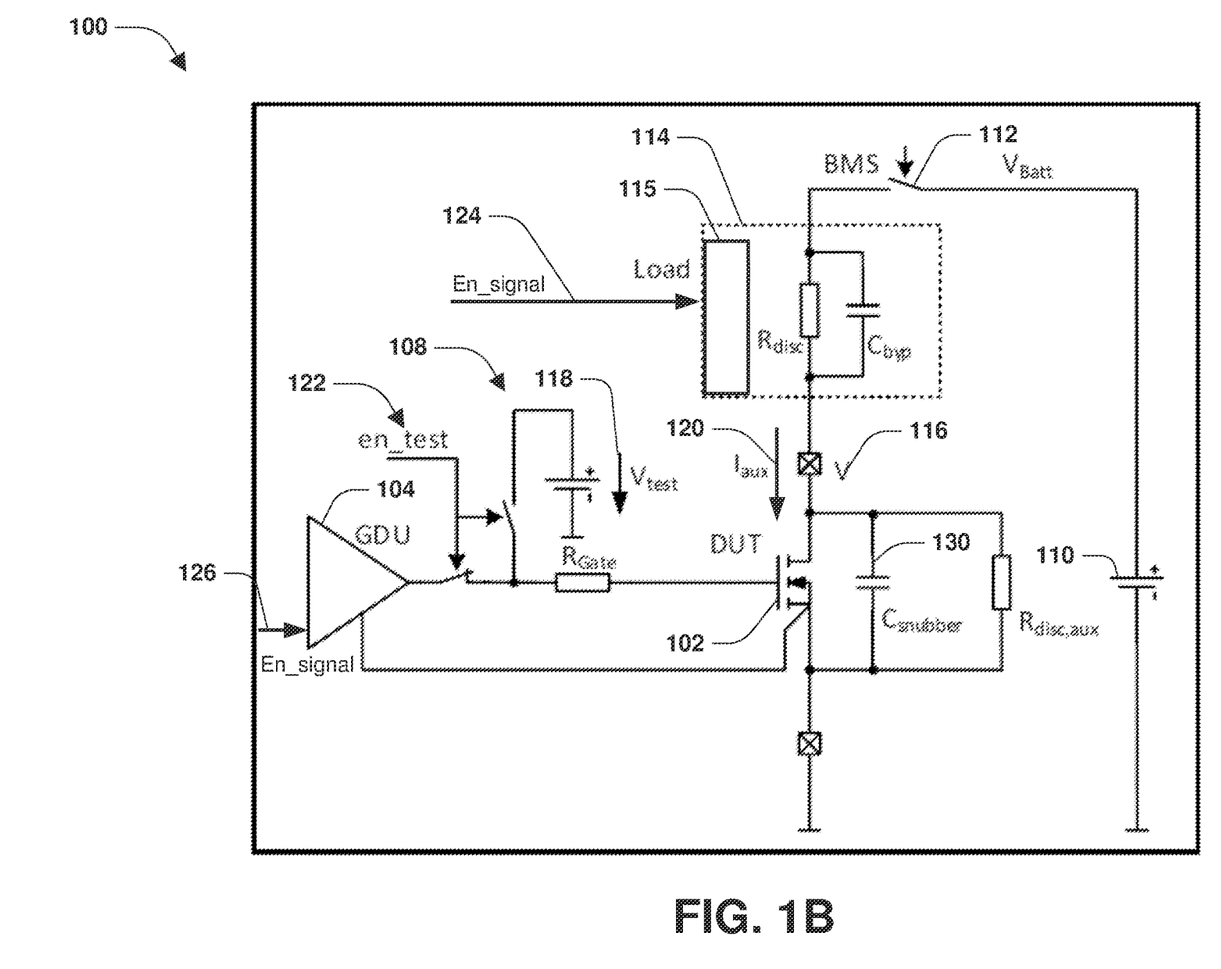
FIG. 1B is a component block diagram illustrating a leak detection component for current leak detection of a solid state device using a capacitor in accordance with at least some of the techniques presented herein.

As part of performing the test sequence, the leak detection component 109 measures the leakage current output through the solid state device 102 while the test voltage 118 is applied to the gate of the solid state device 102. In some embodiments, the leak detection component 109 may measure the leakage current utilizing a capacitor 130, as illustrated by FIG. 1B. The capacitor 130 is connected to the solid state device 102 in parallel. As part of starting the test sequence, switch 112 is closed (e.g., switch 112 is normally closed), the load 114 is disabled, and the device 102 is opened. In this way, the capacitor 130 is charged up to Vbattery. Then, the switch 112 is opened and the test voltage 118 is applied to the gate of the solid state device 102. Because there is no current feed from Vbattery due to the switch 112 being opened, a discharge rate of the capacitor 130 is proportional to the leakage current of the solid state device 102. In some embodiments, an external source is used to charge the capacitor 103 or a current source may feed into a pin (e.g., pin Vfuse associated with voltage 116) while the load 114 is disabled and the switch 112 is opened. As the test voltage 118 is applied to the gate of the solid state device 102, the leak detection component 109 measures a rate of change of a charge of the capacitor 130 over time to determine whether the rate of change of the charge of the capacitor 130 exceeds a threshold. The larger the rate of change of the charge of the capacitor 130, the larger the leakage current of the solid state device 102. The larger the leakage current of the solid state device 102, the larger the drift of the threshold voltage Vth. The larger the rate of change of the charge of the capacitor 130 (e.g., the rate of change of the charge of the capacitor 130 exceeding the threshold) and the larger the leakage current and the larger the drift of the threshold voltage Vth, then the more the solid state device 102 is operating in a degraded operating state. In some embodiments of performing the test sequence, the test sequence may include charging the capacitor 130, turning on the switch 112, and then measuring the voltage 116 across the switch 112 to identify the rate of change of the charged of the capacitor 130 over time.

If the rate of change of the charge of the capacitor 130 does not exceed the threshold, then the leak detection component 109 determines that the solid state device 102 is operating in a non-degraded operating state. If the rate of change of the charge of the capacitor 130 exceeds the threshold, then the leak detection component 109 determines that the solid state device 102 is operating in a degraded operating state. If the leak detection component 109 determines that the solid state device 102 is operating in a degraded operating state, then the leak detection component 109 may generate a signal, such as a warning signal that the solid state device 102 is unhealthy, operating in the degraded operating state, and/or should be replaced (e.g., the signal may cause a light on the apparatus 100 to turn on, a message to be displayed on the apparatus 100, or a message to be transmitted to a remote device over a communication network).

Figure 1C:
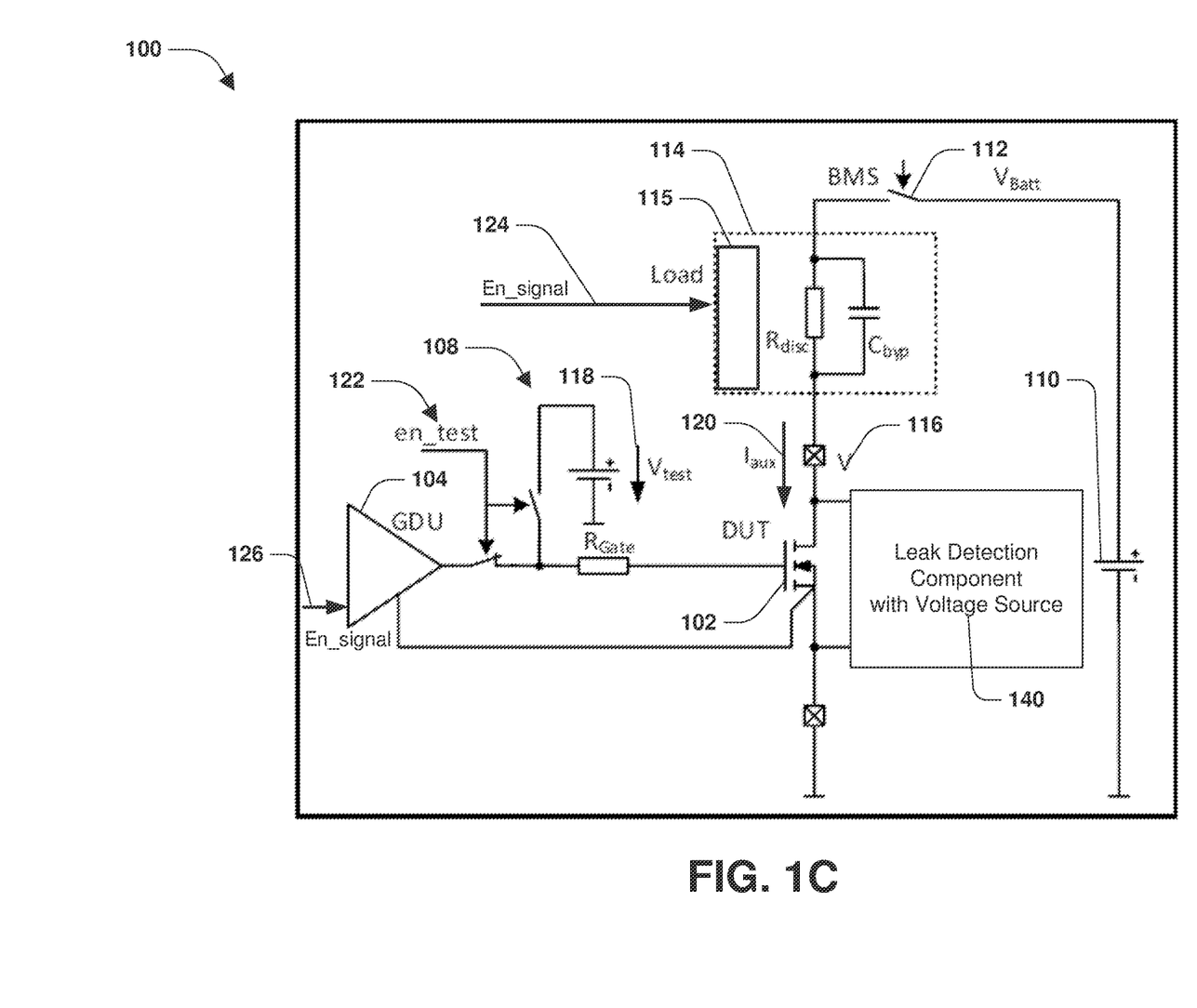
Figure 1D:
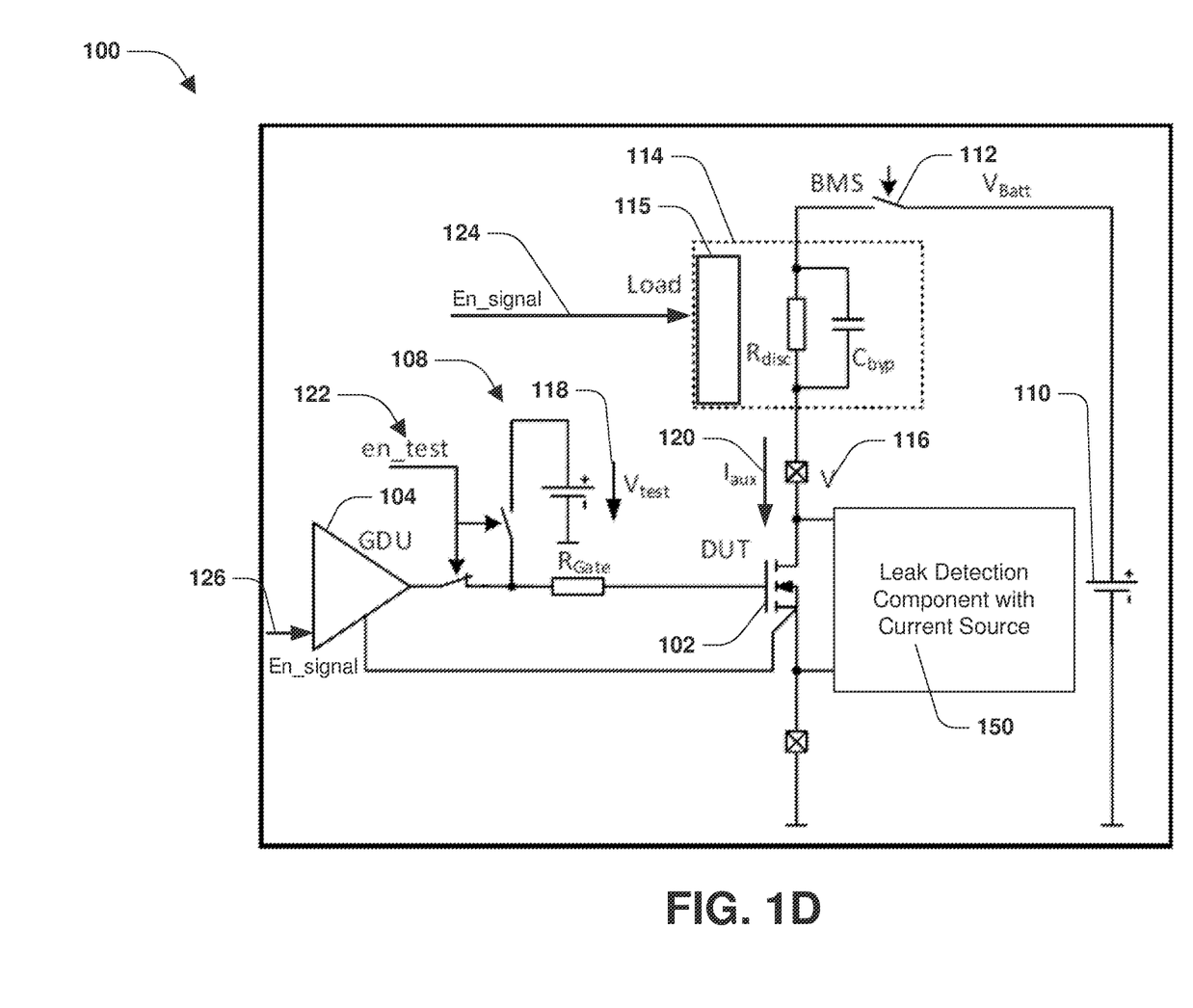
FIG. 1D is a component block diagram illustrating a leak detection component for current leak detection of a solid state device using a current source in accordance with at least some of the techniques presented herein.

It may be appreciated that the leak detection component 109 may utilize other components and/or functionality than the capacitor 130 for measuring the leakage current of the solid state device 102. In some embodiments, the leak detection component 109 utilizes a voltage source 140 as part of the test sequence for measuring the leakage current, as illustrated by FIG. 1C. The voltage source 140 may be an independent voltage source from other voltage sources of the apparatus 100 such as the voltage source 110. In some embodiments, the leak detection component 109 utilizes a current source 150 as part of the test sequence for measuring the leakage current, as illustrated by FIG. 1D. The current source 150 may apply a current to a drain potential of a drain of the solid state device 102. Instead of applying the test voltage 118 as part of the test sequence, a current through the solid state device 102 is measured to determine the leakage current of the solid state device 102. In some embodiments, a leak detection component may be implemented as a current measurement device in series with the solid state device 102.

Figure 2:
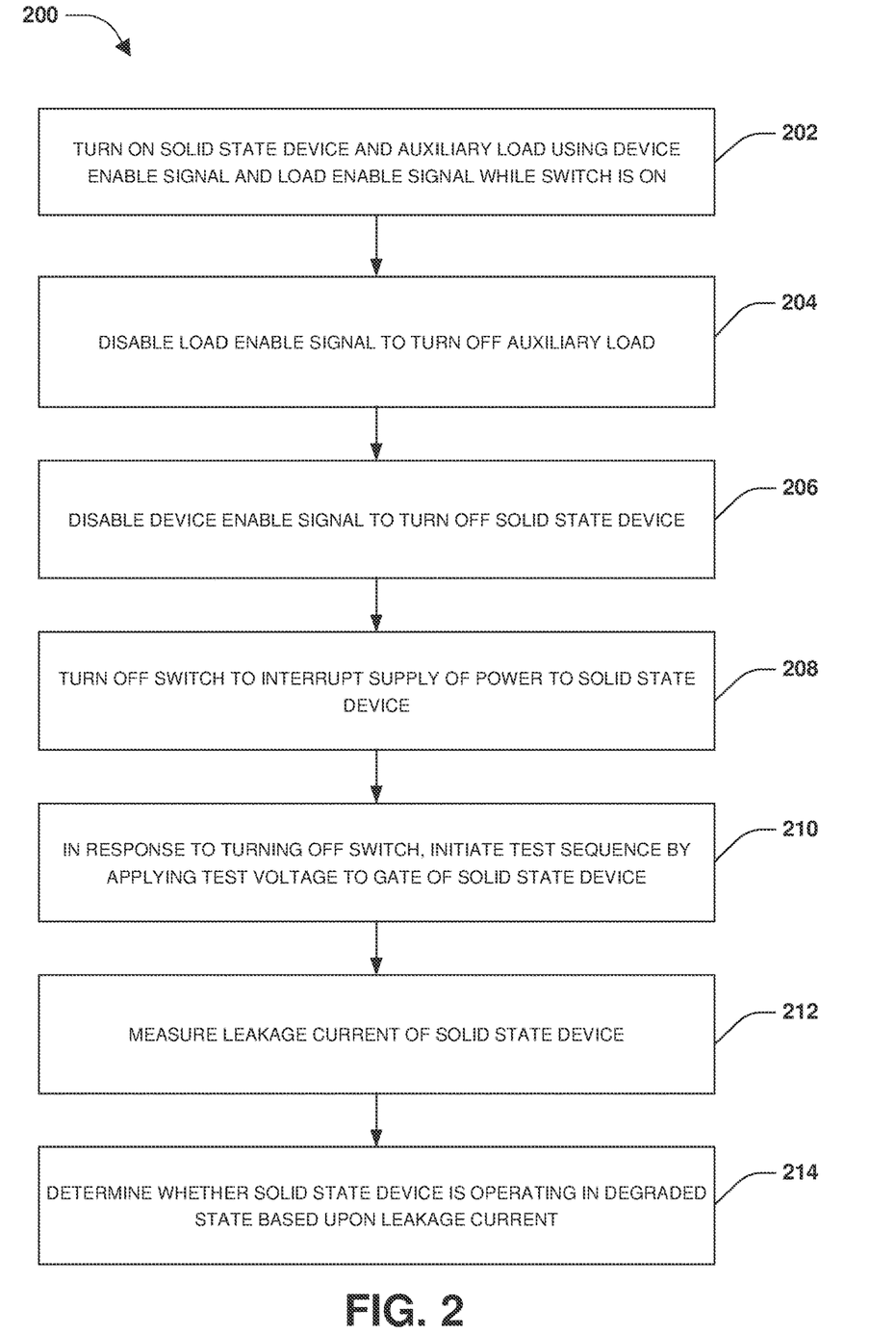
FIG. 2 is an illustration of an example method for current leak detection of a solid state device in accordance with at least some of the techniques presented herein.

FIG. 2 illustrates a method 200 for detecting leakage current of the solid state device 102. During operation 202 of method 200, the solid state device 102 is turned on using the device enable signal 126. In some embodiments, the device enable signal 126 causes the gate driver 104 to apply a voltage to the gate of the solid state device 102. The voltage is equal to or greater than the threshold voltage Vth of the solid state device 102. This causes the solid state device 102 to turn on. In some embodiments, the solid state device 102 is turned on while the switch 112 is on (e.g., closed so that the voltage source 110 is connected to the load 114 and/or the solid state device 102). In some embodiments, the load 114 is turned on using the load enable signal 124. In this way, the switch 112 is closed, and the solid state device 102 and the load 114 are turned on into an operational state.

The leak detection component 109 may determine that a test sequence is to be initiated to determine whether the solid state device 102 is operating in a non-degraded operating state or a degraded operating state (e.g., a threshold amount of time has passed since a prior test sequence was performed). Accordingly, during operation 204 of method 200, the load enable signal 124 is disabled in order to turn off the load 114. In this way, the load 114 is not drawing power, such as from the voltage source 110, while off. In some embodiments, the load 114 is turned off while the switch 112 is still on (closed).

During operation 206 of method 200, the device enable signal 126 is disabled to turn off the solid state device 102. In particular, the device enable signal 126 is an input into the gate driver 104 in order to control the gate driver 104. Disabling the device enable signal 126 triggers the gate driver 104 to stop applying the voltage, greater than the threshold voltage Vth, to the gate of the solid state device 102, thus turning off the solid state device 102. In particular, the gate driver 104 provides an off-level gate driver signal to the solid state device 102.

During operation 208 of method 200, the switch 112 is turned off to interrupt the supply of power to the solid state device 102. In some embodiments, the switch is turned off (opened) in order to interrupt the supply of power from the voltage source 110 through the load 114 to the source of the solid state device 102. Once the switch is turned off, and the load 114 and the solid state device 102 are turned off, the test sequence triggers the test circuitry 108 to apply the test voltage 118 to the gate of the solid state device 102.

During operation 210 of method 200, the test sequence is initiated by applying the test voltage 118 to the gate of the solid state device 102 using the test circuitry 108. The test voltage 118 is less than the threshold voltage Vth such that if the solid state device 102 is operating in a non-degraded operating state (e.g., experiencing little to no threshold voltage Vth drift), then the solid state device 102 will not turn on and will not generate a large leakage current. In some embodiments, the test sequence of the test voltage 118 being applied to the gate of the solid state device 102 and the leak detection component 109 determining a leakage current inducted by the test voltage 118 is performed in-situ when the apparatus 100 is deployed and operational (e.g., during a power up/down sequence of a vehicle boardnet of a vehicle). In some embodiments, the test voltage 118 is applied to the gate of the solid state device 102 while the solid state device 102 is in an off state where the gate driver 104 is not applying the voltage greater than the threshold voltage Vth to the gate of the solid state device 102.

During operation 212 of method 200, the leak detection component 109 measures the leakage current from the solid state device 102. The leakage current may be induced by the test voltage 118 being applied to the gate of the solid state device 102. Various techniques may be used to measure the leakage current or other operational properties of the solid state device 102, such as through the use of the capacitor 130 of FIG. 1B, the voltage source 140 of FIG. 1C, the current source 150 of FIG. 1D, etc. In some embodiments of using the capacitor 130, the leak detection component 109 measures a rate of change of a charge of the capacitor 130 over time. The leakage detection components determines the leakage current based upon the rate of change of the charge of the capacitor 130 over time.

During operation 214 of method 200, the leak detection component 109 determines whether the solid state device 102 is operating in a degraded operating state or a non-degraded operation state based upon the leakage current of the solid state device 102 and/or the rate of change of the charge of the capacitor 130 over time. If the leak detection component 109 determines that the solid state device is in the degraded operating state (e.g., the leakage current exceeds a threshold; the threshold voltage Vth has drifted by 1V, 2V, or some other voltage such as where a 3.5V drift that would be catastrophic if the threshold voltage Vth is 3.5V), then the leak detection component 109 may generate a warning signal (e.g., turn on or blink a warning light of the apparatus 100, display an alert on a display of the apparatus 100, transmit the warning signal to a remote device or computer to notify a user, etc.).

Figure 3:
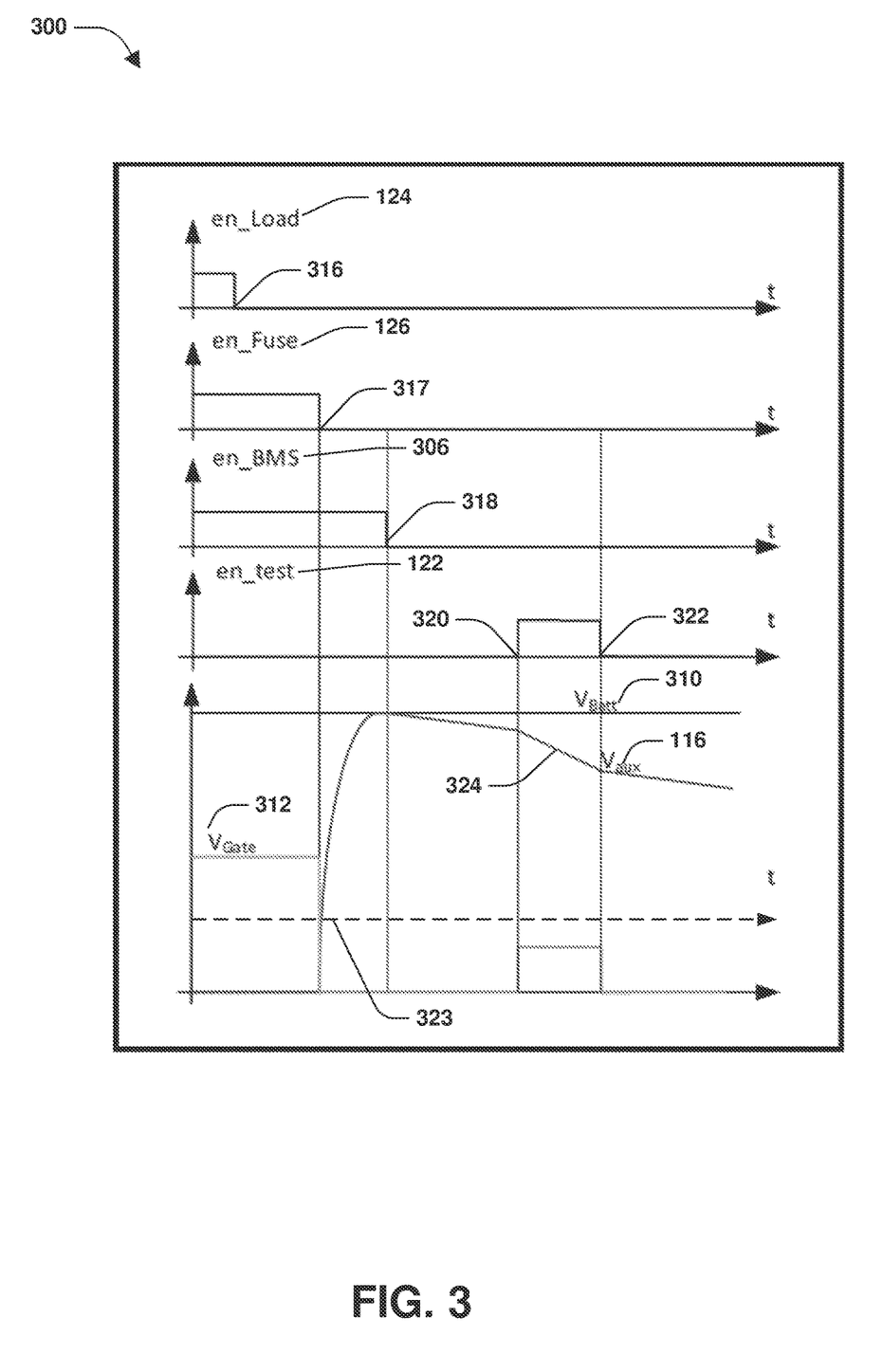
FIG. 3 is an illustration of a timing diagram associated with solid state device leak detection in accordance with at least some of the techniques presented herein.

FIG. 3 illustrates a timing diagram 300 associated with solid state device leak detection. The x-axis represents time during which the test sequence may be performed. The load enable signal 124 is initially enabled (high) so that the load 114 is on and operational. The device enable signal 126 is also initially enabled (high) so that the gate driver 104 applies a voltage to the gate of the solid state device 102. The voltage applied to the gate of the solid state device 102 is equal to or larger than the threshold voltage Vth 323 of the solid state device 102 (e.g., greater than 3.5V, 4.5V, or some other threshold voltage), and thus the solid state device 102 is on and operational. A switch enable signal 306, used to control the switch 112, is initially enabled (high) so that the switch 112 is on (closed).

A determination is made that the test sequence is to be performed. Accordingly, the load enable signal 124 is disabled (low) at a first point in time 316 to turn off the load 114. The device enable signal 126 is disabled (low) at a second point in time 317 to turn off the solid state device 102 by controlling the gate driver 104 to stop applying the voltage to the gate of the solid state device 102. The switch enable signal 306 is disabled (low) at a third point in time 318 so that the switch 112 is off (opened). The switch 112 may be turned off once the voltage 116 has reached a battery voltage 310 of the voltage source 110.

At a fourth point in time 320, the test enable signal 122 is enabled (high) to cause the test circuitry 108 to apply the test voltage 118 to the gate of the solid state device 102, which has a gate voltage 312. A rate of change 324 of a charge of the capacitor 130 is measured while the test voltage 118 is applied to the gate of the solid state device 102 in order to determine an increase in leakage current of the solid state device 102 from the test voltage 118 being applied to the gate of the solid state device 102. Once the leakage current and/or a drift of the threshold voltage Vth is determined, the test enable signal 122 is disabled (low) at a fifth point in time 322 to complete the test sequence.

Figure 4:
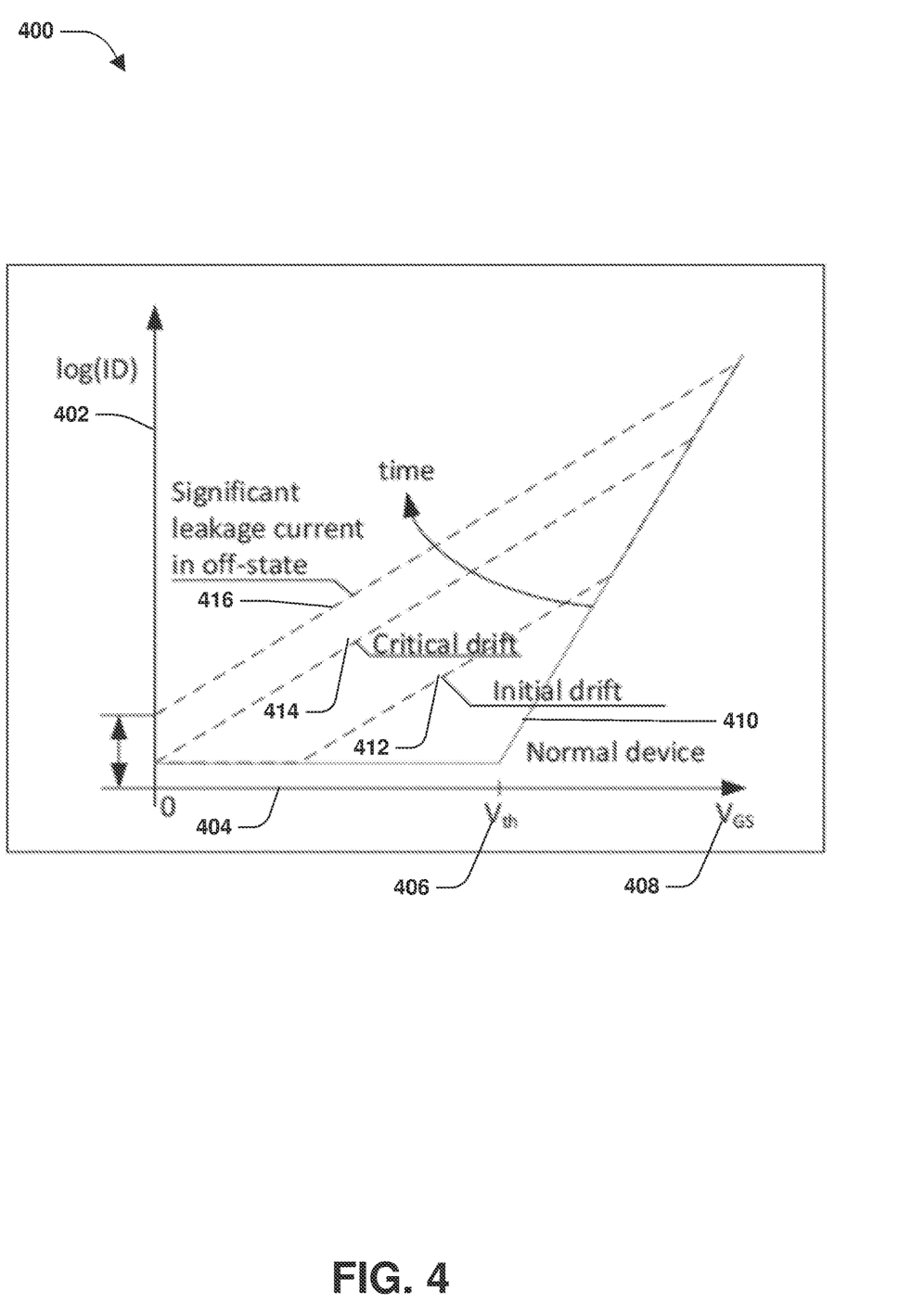
FIG. 4 is an illustration of voltage threshold drifts of a solid state device in accordance with at least some of the techniques presented herein.

FIG. 4 illustrates a diagram 400 depicting various voltage threshold drifts of the solid state device 102. The x-axis 404 represents voltage, such as the threshold voltage Vth 406 of the solid state device 102 and a gate-source voltage bias 408 of the solid state device 102. The y-axis 402 represents current from the solid state device 102, such as leakage current produced before a voltage applied to the gate of the solid state device 102 reaches the threshold voltage Vth 406. A current curve 410 represents current from the solid state device 102 if the solid state device is operating in a non-degraded operating state. The current curve 410 shows that there is little to no leakage current before the voltage applied to the gate reaches the threshold voltage Vth 406. Once the threshold voltage Vth 406 is reached, then current from the solid state device 102 increases because the solid state device 102 is on and operational.

As the solid state device 102 experiences voltage threshold drift, leakage current from the solid state device 102 will occur before the threshold voltage Vth 406 is reached. The current curve 412 illustrates how leakage current from the solid state device 102 occurs before the threshold voltage Vth 406 is reached, which is indicative of a leakage current due to drift in the threshold voltage Vth 406. Current curve 414 illustrates critical drift in the threshold voltage Vth 406 where there is leakage current well before the threshold voltage Vth 406 is reached. Current curve 416 illustrates very critical drift in the threshold voltage Vth 406 where the solid state device 102 may not even be able to turn off and there is significant leakage current while the solid state device 102 is supposed to be off. As previously discussed, the techniques described herein are capable of detecting these leakage currents and voltage threshold drifts during operation of the solid state device 102 in order to provide early detection and warning of imminent or potential future failures.

An embodiment of the presently disclosed techniques comprises an apparatus. The apparatus comprises a solid state device; a switch in series with the solid state device; a leak detection component connected to the solid state device; and a gate driver configured to drive a gate of the solid state device, wherein the gate driver comprises test circuitry configured to apply a test voltage to the gate of the solid state device, wherein the test voltage is less than a threshold voltage of the solid state device, and wherein a leakage current of the solid state device is detected by the leak detection component.

According to some embodiments, a signal is generated based upon the leakage current of the solid state device to indicate whether the solid state device is operating in a degraded operating state or a non-degraded operating state.

According to some embodiments, a drift of the threshold voltage of the solid state device is determined based upon the leakage current.

According to some embodiments, the test voltage is applied to the gate of the solid state device and the leakage current is determined in-situ during operation of the apparatus and the solid state device.

According to some embodiments, the leak detection component comprises a capacitor connected in parallel to the solid state device, wherein the capacitor is charged when the switch is closed, and wherein the leak detection component detects the leakage current based upon a rate of a change of a charge of the capacitor over a period of time exceeding a threshold when the switch is open.

According to some embodiments, the test voltage is applied to the gate of the solid state device while the solid state device is in an off state.

According to some embodiments, the test circuitry comprises a series switch for the gate.

According to some embodiments, the test circuitry comprises a voltage source that produces the test voltage.

According to some embodiments, the apparatus is a circuit breaker or e-Fuse.

An embodiment of the presently disclosed techniques comprises a method. The method comprises turning on a solid state device using a device enable signal and turning on a load using a load enable signal while a switch is on; disabling the load enable signal to turn off the load; disabling the device enable signal to turn off the solid state device; turning off the switch to interrupt supply of power to the solid state device; in response to turning off the switch, initiate a test sequence by applying a test voltage to a gate of the solid state device; measuring a leakage current of the solid state device; and determining whether the solid state device is operating in a degraded operating state based upon the leakage current.

According to some embodiments, the initiating the test sequence comprises measuring a rate of a change of a charge of a capacitor over time, wherein the capacitor is connected to the solid state device in parallel; and determining whether the solid state device is operating in the degraded operating state based upon the rate of the change of the charge of the capacitor over time.

According to some embodiments, the initiating the test sequence comprises determining the leakage current of the solid state device based upon a rate of a change of a charge of a capacitor over time, wherein the capacitor is connected to the solid state device in parallel; and determining whether the solid state device is operating in the degraded operating state based upon the leakage current.

According to some embodiments, the initiating the test sequence comprises applying, by test circuitry integrated into a gate driver, the test voltage to the gate of the solid state device, wherein the test voltage is less than a threshold voltage of the solid state device; and determining whether the solid state device is operating in the degraded operating state based upon the leakage current induced by the test voltage.

According to some embodiments, the test sequence is performed in-situ during operation of an apparatus comprising the solid state device.

According to some embodiments, the method comprises in response to determining that the solid state device is operating in the degraded operating state, generating a warning signal.

According to some embodiments, the initiating the test sequence comprises applying, by test circuitry integrated into a gate driver, the test voltage to the gate of the solid state device while the solid state device is in an off state.

An embodiment of the presently disclosed techniques comprises an apparatus. The apparatus comprises a gate driver connected to and configured to drive a gate of a solid state device in series with a switch, wherein the solid state device is in parallel with a capacitor charged by an auxiliary voltage when the switch is open, and wherein the gate driver comprises test circuitry configured to: apply a test voltage to the gate of the solid state device, wherein a rate of change of a charge of the capacitor over time is determined while the test voltage is applied to the gate of the solid state device, and wherein the rate of change of the charge of the capacitor over time is evaluated against a threshold rate change to determine whether the solid state device is operating in a degraded operating state.

According to some embodiments, the rate of change of the charge of the capacitor over time is used to determine a leakage current of the solid state device, and wherein the leakage current is used to determine whether the solid state device is operating in the degraded operating state.

According to some embodiments, the degraded operating state corresponds to a drift in a threshold voltage of the solid state device.

According to some embodiments, the test circuitry is configured to perform a test sequence to determine whether the solid state device is operating in the degraded operating state, wherein the test sequence includes charging the capacitor, turning on the switch, applying the test voltage to the gate of the solid state device, and measuring the auxiliary voltage across the switch to identify the rate of change of the charge of the capacitor over time.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
   a solid state device;
   a switch in series with the solid state device;
   a leak detection component comprising a capacitor connected in parallel to the solid state device, wherein the capacitor is charged when the switch is closed; and
   a gate driver configured to drive a gate of the solid state device, wherein the gate driver comprises test circuitry configured to apply a test voltage to the gate of the solid state device, wherein the test voltage is less than a threshold voltage of the solid state device, and wherein a leakage current of the solid state device is detected by the leak detection component based upon a rate of a change of a charge of the capacitor over a period of time exceeding a threshold when the switch is open.

2. The apparatus of claim 1, wherein a signal is generated based upon the leakage current of the solid state device to indicate whether the solid state device is operating in a degraded operating state or a non-degraded operating state.

3. The apparatus of claim 1, wherein a drift of the threshold voltage of the solid state device is determined based upon the leakage current.

4. The apparatus of claim 1, wherein the test voltage is applied to the gate of the solid state device and the leakage current is determined in-situ during operation of the apparatus and the solid state device.

5. The apparatus of claim 1, wherein the leak detection component is connected to a source and a drain of the solid state device for measuring the leakage current.

6. The apparatus of claim 1, wherein the test voltage is applied to the gate of the solid state device while the solid state device is in an off state.

7. The apparatus of claim 1, wherein the test circuitry comprises a series switch for the gate.

8. The apparatus of claim 1, wherein the test circuitry comprises a voltage source that produces the test voltage.

9. The apparatus of claim 1, wherein the apparatus is a circuit breaker or e-Fuse.

10. A method for testing a solid state device, comprising:
turning on a solid state device using a device enable signal and turning on a load using a load enable signal while a switch is on;
disabling the load enable signal to turn off the load;
disabling the device enable signal to turn off the solid state device;
turning off the switch to interrupt supply of power to the solid state device;
in response to turning off the switch, initiate a test sequence by applying a test voltage to a gate of the solid state device;
determining a leakage current of the solid state device based upon a rate of a change of a charge of a capacitor over time, wherein the capacitor is connected to the solid state device in parallel; and
determining whether the solid state device is operating in a degraded operating state based upon the leakage current.

11. The method of claim 10, wherein initiating the test sequence comprises:
applying, by test circuitry integrated into a gate driver, the test voltage to the gate of the solid state device.

12. The method of claim 10, wherein initiating the test sequence comprises:
applying, by test circuitry integrated into a gate driver, the test voltage to the gate of the solid state device, wherein the test voltage is less than a threshold voltage of the solid state device.

13. The method of claim 10, wherein initiating the test sequence comprises:
applying, by test circuitry integrated into a gate driver, the test voltage to the gate of the solid state device, wherein the test voltage is less than a threshold voltage of the solid state device; and
determining whether the solid state device is operating in the degraded operating state based upon the leakage current induced by the test voltage.

14. The method of claim 10, wherein the test sequence is performed in-situ during operation of an apparatus comprising the solid state device.

15. The method of claim 10, comprising:
in response to determining that the solid state device is operating in the degraded operating state, generating a warning signal.

16. The method of claim 10, wherein initiating the test sequence comprises:
applying, by test circuitry integrated into a gate driver, the test voltage to the gate of the solid state device while the solid state device is in an off state.

17. An apparatus, comprising:
a gate driver connected to and configured to drive a gate of a solid state device in series with a switch, wherein the solid state device is in parallel with a capacitor charged by an auxiliary voltage when the switch is open, and wherein the gate driver comprises test circuitry configured to:
apply a test voltage to the gate of the solid state device, wherein a rate of change of a charge of the capacitor over time is determined while the test voltage is applied to the gate of the solid state device, and wherein the rate of change of the charge of the capacitor over time is evaluated against a threshold rate change to determine whether the solid state device is operating in a degraded operating state.

18. The apparatus of claim 17, wherein the rate of change of the charge of the capacitor over time is used to determine a leakage current of the solid state device, and wherein the leakage current is used to determine whether the solid state device is operating in the degraded operating state.

19. The apparatus of claim 17, wherein the degraded operating state corresponds to a drift in a threshold voltage of the solid state device.

20. The apparatus of claim 17, wherein the test circuitry is configured to perform a test sequence to determine whether the solid state device is operating in the degraded operating state, wherein the test sequence includes charging the capacitor, turning on the switch, applying the test voltage to the gate of the solid state device, and measuring the auxiliary voltage across the switch to identify the rate of change of the charge of the capacitor over time.

* * * * *